(12) United States Patent  
Lin

(10) Patent No.: US 7,239,513 B2
(45) Date of Patent: Jul. 3, 2007

(54) POWER CONTROL DEVICE

(76) Inventor: Saul Lin, No. 21, Jentzu 7 St., Jenwu Hsiang, Kaohsiung Hsien (TW)

( * ) Notice: Subject to any disclaimer, the term of this patent is extended or adjusted under 35 U.S.C. 154(b) by 267 days.

(21) Appl. No.: 11/112,091

(22) Filed: Apr. 22, 2005

(65) Prior Publication Data

US 2006/0238975 A1 Oct. 26, 2006

(51) Int. Cl.
*H05K 7/20* (2006.01)
(52) U.S. Cl. .................................................. 361/697
(58) Field of Classification Search ................ 361/697, 361/686, 702, 711; 439/485, 487, 492
See application file for complete search history.

(56) References Cited

U.S. PATENT DOCUMENTS

| | | | | |
|---|---|---|---|---|
| 3,612,789 A | * | 10/1971 | Marquis et al. ............... | 200/47 |
| 3,738,178 A | * | 6/1973 | Marquis et al. ............... | 74/3.5 |
| 3,774,050 A | * | 11/1973 | Littwin ........................ | 307/66 |
| 4,205,434 A | * | 6/1980 | Brozoski et al. .............. | 29/860 |
| 4,255,775 A | * | 3/1981 | Andrews ....................... | 96/25 |
| 4,688,134 A | * | 8/1987 | Freeman et al. .............. | 361/45 |
| 5,644,464 A | * | 7/1997 | Zhou ........................... | 361/115 |
| 6,288,882 B1 | * | 9/2001 | DiSalvo et al. ............... | 361/42 |
| 6,369,688 B1 | * | 4/2002 | Abe et al. .................... | 337/299 |
| 6,650,515 B2 | * | 11/2003 | Schmalz ....................... | 361/42 |

* cited by examiner

*Primary Examiner*—Chandrika Prasad
(74) *Attorney, Agent, or Firm*—patenttm.us; James H. Walters

(57) ABSTRACT

The power control device has three units, each having two cooling fins set in opposed positions. Every cooling fin has an SCR mounted to adjust the voltage change. One of the two opposed cooling fins has a reed and a circuit board mounted thereon, and the power supply is able to be provided to the circuit board through the cooling fin, and the reed has a first contact therein and a second contact in the opposed cooling fin. When the motor is activated or turned off, the SCR makes the voltage change smoothly. When the motor is in normal operation, the first contact of the reed is connected to the second contact, so the current will steer clear of the SCR and pass the cooling fin. The cooling fins perform as a relay during the operation period, and the overheating problem of the SCR is eliminated.

12 Claims, 4 Drawing Sheets

POWER CONTROL DEVICE

BACKGROUND OF THE INVENTION

1. Field of the Invention

The present invention relates to a power control device, and particularly relates to a power control device that can switch to a bypass relay when the power is in full output, thus the temperature rise of the elements such as motor soft starter, solid state relay, thermistor, etc can be controlled. In addition, its simple structure not only reduces size and cost, but also simplifies the whole design.

2. Description of Related Art

A power control device is often applied in electric equipment to adjust the power volume, instead of only connecting the electric equipment to the power supply through an electromagnetic relay. For example, when a motor is activated, full voltage will be input, leading to an excessive current and a pull-in torque which may be harmful to the motor. So, a power control device is applied to control the voltage change at start and stop moments, whereby the voltage will not change sharply at those two moments and the motor is protected.

The power control device generally employs SCRs (silicon controlled rectifier) to realize the buffering process, however, if the current passes through the SCR during the whole operation, the SCR may become overheated, therefore a cooling fin is provided to dissipate excessive heat, but the cooling fin will increase the size of the equipment. Another way to reduce the heat rate is to provide an electromagnetic relay, and when the motor is in a stable operation, the current is switched to the electromagnetic relay, but that will further increase the size and the design is more complex.

To have both the advantages of the electromagnetic relay and the power control function, it is more preferable to combine the two elements to a single control device. With reference to FIG. 5, a motor soft starter has a relay built in. The starter has two main circuit boards (50), (52), a relay connecting board (53) with three relays (51) mounted thereon, and a triggering circuit (58) with three circuit boards (54) mounted thereon corresponding to the three relays (51). Each circuit board (54) has two SCRs (55) mounted thereon, and a heat sink (60) is fitted opposite each SCR (55). Every circuit board (54) has a first conducting strip (57) and a second conducting strip (59) respectively provided at opposite ends, and the first conducting strip (57) is at the current input end, and the second conducting strip (59) is at the current output end. The two conducting strips (57), (59) are connected to the relay connecting board (53). The input and output of the three relays (51) are respectively connected to the input and output of the SCR. When the motor is in stable operation, the current is made to pass through the relay, but the relays (51) take up most of the space, leaving little space for the cooling fin (60).

Therefore, the invention provides a power control device to mitigate or obviate the aforementioned problems.

SUMMARY OF THE INVENTION

The main objective of the present invention is to provide a power control device with SCRs which incorporates a relay. When in activating or ceasing processes, the SCRs will operate to control the voltage change and cooling fins are employed for heat emission; when the motor is in normal operation, two cooling fins function as a relay. Other objectives, advantages and novel features of the invention will become more apparent from the following detailed description when taken in conjunction with the accompanying drawings.

BRIEF DESCRIPTION OF THE DRAWINGS

FIG. 4 is a sectional top view when the relay performed by cooling fins is ON.

DETAILED DESCRIPTION OF THE PREFERRED EMBODIMENT

Figure 1:
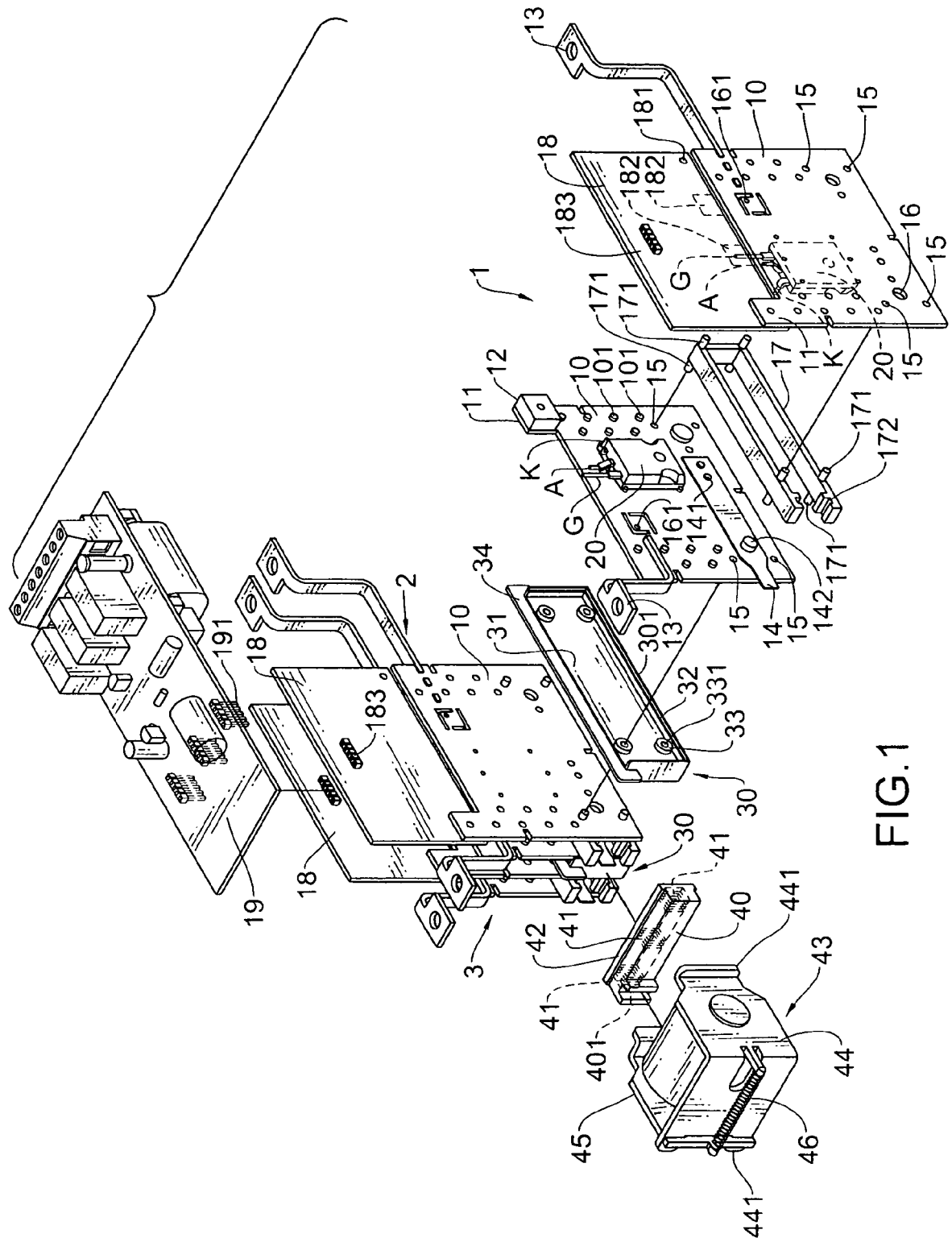
FIG. 1 is an exploded perspective view in accordance with this invention.
Figure 2:
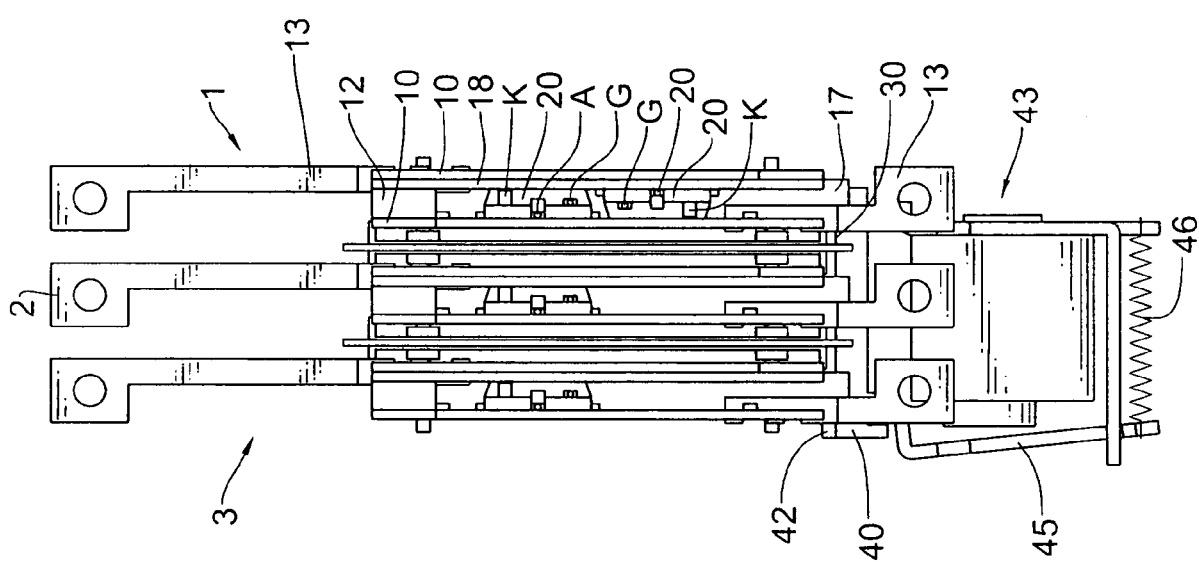
FIG. 2 is a top view in accordance with this invention.

With reference to FIGS. 1-2, the power control device has three units (1), (2), (3) and a main control board (19). Each unit has two cooling fins (10) provided at opposite sides thereof and each cooling fin (10) has a silicon controlled rectifier (SCR) (20) mounted thereon. The SCR (20) has an anode (A), a cathode (K) and a gate (G). The anode is connected in the same cooling fin (20) with the SCR (20), while the cathode is connected to the opposed cooling fin (20) by welding at a first opening (161) or by screws, so in every unit, the two SCRs (20) are in parallel connection and opposite in phase. Every cooling fin (10) also has a reed (14) mounted thereon with one end of the reed (14) extended beyond the cooling fin (10). The reed (14) has a first contact (142) therein and a second contact (16) in the opposed cooling fin (10), and all the reeds (14) are connected together by a rod (40) which has a first slot (401). A pusher such as an electromagnet (43) is fitted in the power control device, which is secured in a supporter (44) with two slips (441) in opposed positions. The supporter (44) has a movable tab (45) inserted to the first slot (401), whereby the electromagnet is mounted with the cooling fin (10).

An insulating frame (17) with three walls and an open end is mounted between the two cooling fins (10). Multiple shafts (171) are set in the frame corresponding to a plurality of holes (15) in the cooling fin (10), and the shafts (171) are inserted into the holes (15), whereby the frame is fixed to the cooling fin (10), so the two cooling fins (10) are arranged with the insulating frame (17) therebetween. Two channels (172) are set in the opposed walls of the frame (17). When the cooling fin (10) and the insulating frame (17) are mounted together, the reed (14), the first contact (142) and the second contact (16) are all hidden in the frame (17).

A projection (11) is formed in an upper end of each cooling fin (10), and an electric conduction holder (13) is fitted at the cooling fin (10) by means of riveting, so one cooling fin (10) has an electric conduction holder (13) for input and the opposed cooling fin has an electric conduction holder (13) for output.

One of the cooling fins (10) in each unit is mounted with a circuit board (18) which is in contact with the projection (11) and fastened by a screw; the power supply is connected to the circuit board (18) through the cooling fin (10). A shim (12), made of conducting material, is padded to the projection (11), which can make the two mounted cooling fins (10) more compact. A temperature sensing element (not shown) can also be built in the shim (12) to sense the temperature of the cooling fin (10).

One face of the shim (12) is in contact with the circuit board (18) and can be fastened to the circuit board (18) through a bolt hole (181), so an electric loop is formed. Gates (G) of the two SCRs are welded in the circuit board (18) at two welding points (182). The circuit board (18) also has a first connector (183) linked with a second connector (191) in the main control board (19). A plurality of first protrusions (101) is spread in one face of the cooling fin (10) by means of punching, which is of help to heat dissipation.

The reed (14) has a second opening (not numbered), and a second protrusion (141) formed on the cooling fin (10) is inserted through the second opening of the reed (14), whereby the reed (14) is fastened to the cooling fin (10). The first contact (142) corresponds to the second contact (16), both of which are hidden in the frame (17).

A fixer (30) is provided between two adjacent units to conjoin those elements. The fixer (30) is a case (301) with an open end. A second slot (32) is defined in the one edge of the case (301). A board (31) is formed in the fixer (30) with an upper portion (34) on which an insulating piece (not numbered) is adhered to increase an insulating area. A plurality of third protrusions (33) are formed in both faces of the board (31), and each third protrusion has a second opening (331). The edge of the cooling fin (10) can be secured in the second slot (32). The shaft (171) is inserted to the opening (331), whereby the three units (1), (2), (3) are combined together, then the fixer (30) and the board (31) with the insulating piece become an insulating layer between every two units.

Two flanges (42) are formed in the two opposed edges of the rod (40) and multiple third slots (41) are defined therein. The two flanges (42) can slide in the two channels (172) of the frame (17). Distal ends of the reeds (14) are respectively inserted in the third slots (41) and a distal end of the movable tab (45) is inserted to the first slot (401). A spring (46) is mounted at the bottom of the electromagnet (43), and a front end of the spring (46) is connected to the movable tab (45). Once the magnetic force has disappeared, the movable tab (45) will be pulled by the spring (46) to the original position.

Figure 4:
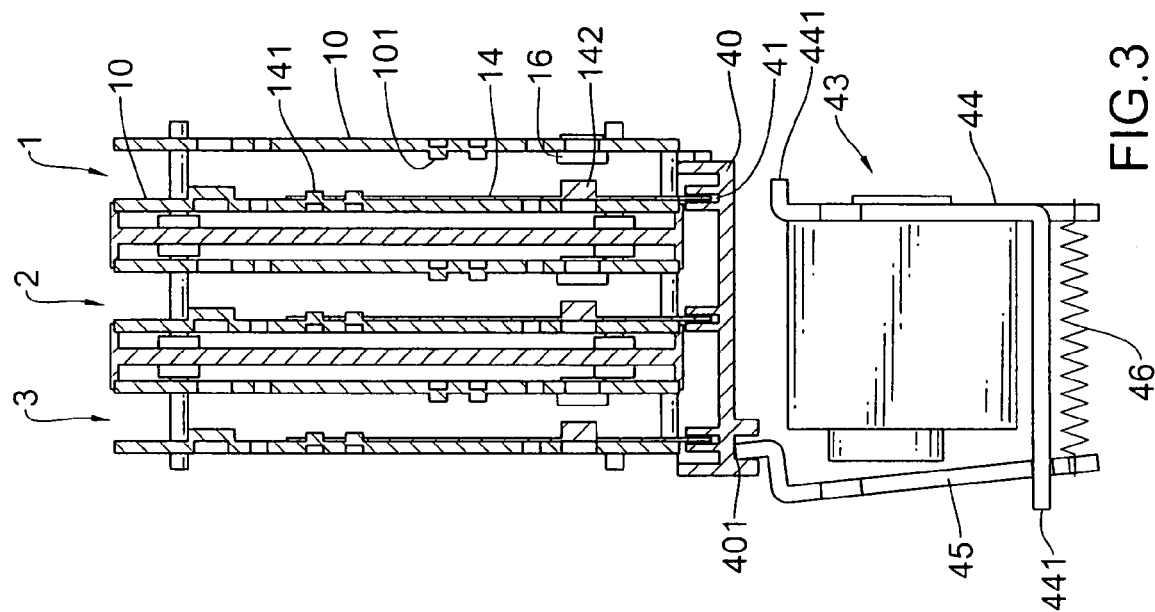
Figure 3:
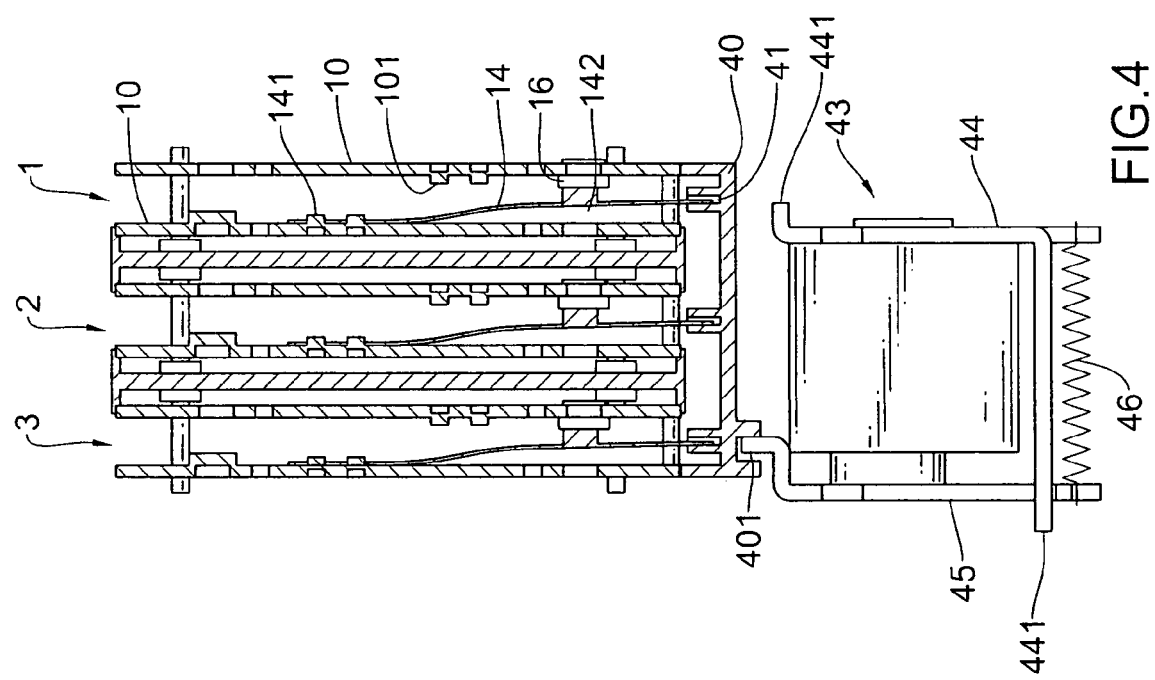
FIG. 3 is a sectional top view when the relay performed by cooling fins is OFF.
Figure 5:
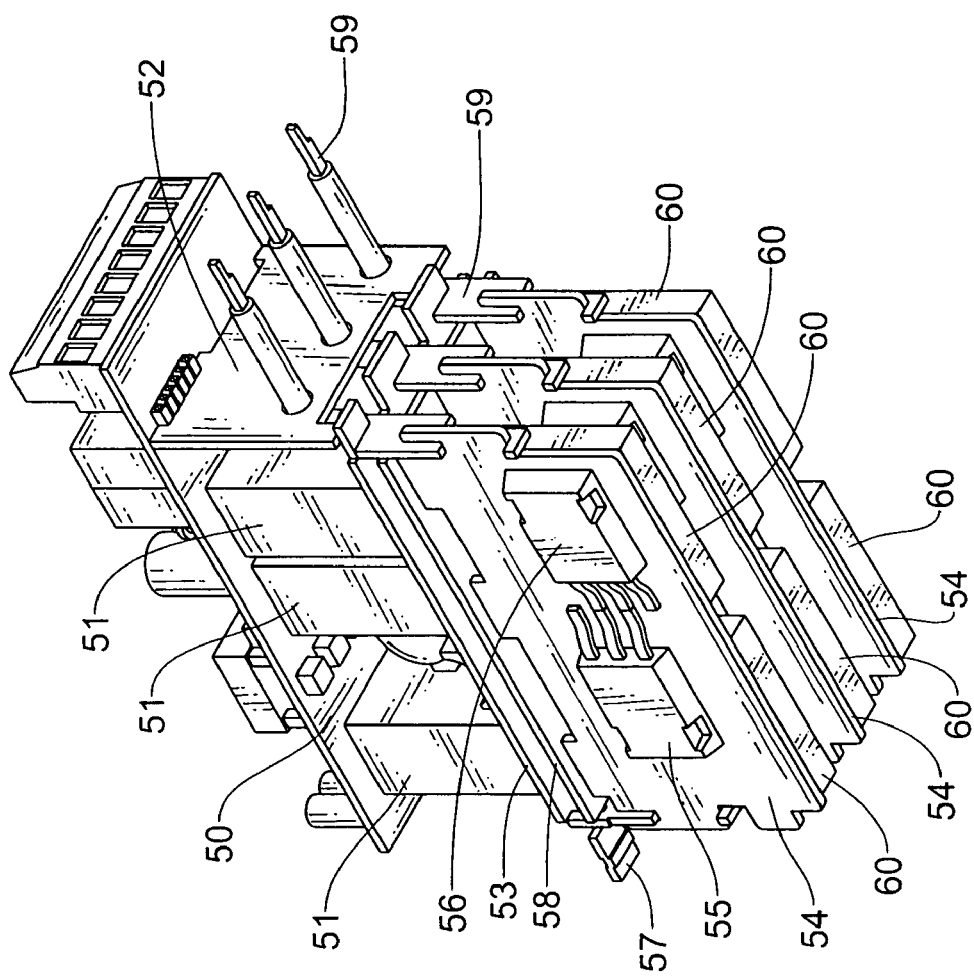
FIG. 5 is a perspective view of a conventional power control device.

With reference to FIG. 3 and FIG. 4, when the motor is activated, the two SCRs come into effect, so the voltage change in the activating and ceasing process is smooth; when the motor is in normal operation after activation, the electromagnet (43) is excited by the power supply to attract the movable tab (45), which further pushes the rod (40) and moves the reed (14), then the first contact (142) will connect to the second contact (16) at the opposed cooling fin (16), thus the current will steer clear of the SCR and pass through the cooling fin (10). Then at that period, the cooling fins (10) perform as a relay. In that way, the overheating problem of the SCR is eliminated.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A power control device comprising:
   multiple units assembled together, each unit including
      two cooling fins mounted in opposed positions, wherein every cooling fin has a silicon controlled rectifier (SCR) mounted thereon, and the SCR has an anode (A), a cathode (K) and a gate (G), the anode is connected in the same cooling fin with the SCR, while the cathode is connected to the opposed cooling fin; and
      a reed having a first contact therein and a second contact in the opposed cooling fin; and
   a pusher which can push the reeds of the units, whereby the first contact is connected to the second contact.

2. The power control device as claimed in claim 1, wherein an insulating frame with three walls and an open end is mounted between the two cooling fins;
   multiple shafts are set in the frame corresponding to a plurality of holes for the shafts in the respective cooling fin, whereby the frame is fixed to the respective cooling fins, so the two cooling fins are arranged with the insulating frame therebetween; and
   two channels are set in opposed walls of the frame.

3. The power control device as claimed in claim 1, wherein a projection is formed in an upper end of each cooling fin, and an electric conduction holder is also fitted at the upper end of each cooling fin.

4. The power control device as claimed in claim 3, wherein a circuit board is in contact with the projection and fastened by a screw, and the power supply is connected to the circuit board through the respective cooling fin.

5. The power control device as claimed in claim 3, wherein a shim is padded to the projection, and a temperature sensing element is built in the shim.

6. The power control device as claimed in claim 3, wherein a plurality of first protrusions is spread in one face of each cooling fin by means of punching.

7. The power control device as claimed in claim 1, wherein the reed has a second opening, which is inserted by a second protrusion in the respective cooling fin, whereby the reed is fastened to the respective cooling fin; and the reed has a first contact therein and a second contact in the opposed cooling fin.

8. The power control device as claimed in claim 1, wherein an electric conduction holder is fitted to each of the cooling fins by means of riveting.

9. The power control device as claimed in claim 1, wherein the pusher is an electromagnet secured in a supporter with two slips in opposed positions, and the supporter has a movable tab.

10. The power control device as claimed in claim 1, wherein a fixer is provided between two adjacent said units, and the fixer is a case with an open end and at least one edge, a slot is defined in the one edge of the case; a board having 2 faces is formed in the fixer with an upper portion on which an insulating piece is mounted; a plurality of protrusions are formed in both said faces of the board, and each protrusion has an opening; ones of said cooling fins have an edge, the edge of the respective cooling fin can be secured in the slot;
   multiple shafts are set in the frame and ones of the respective shafts are inserted to the respective opening, whereby three said units are combined together.

11. The power control device as claimed in claim 1, wherein a rod is mounted between the pusher and the units, the rod has two opposed edges and has two flanges formed in said two opposed edges of the rod; and, a first slot is defined in the rod and multiple second slots are defined in said flanges;
   each reed has a distal end inserted in one of the second slots;

the pusher as an electromagnet secured in a supporter with two slips in opposed positions; and the supporter has a movable tab having a distal end inserted into the first slot.

12. The power control device as claimed in claim 2, wherein a rod is mounted between the pusher and the units, the rod has two flanges formed in two opposed edges of the rod; and a first slot is defined in the rod and multiple second slots are defined in said flanges:

each reed has a distal end inserted in one of the second slots;

the pusher is an electromagnet secured in a supporter with two slips in opposed positions; and the supporter has a movable tab having a distal end inserted into the first slot.

\* \* \* \* \*